United States Patent [19]

Han et al.

[11] Patent Number: 5,894,157
[45] Date of Patent: Apr. 13, 1999

[54] MOS TRANSISTOR HAVING AN OFFSET RESISTANCE DERIVED FROM A MULTIPLE REGION GATE ELECTRODE

[75] Inventors: Min-Koo Han; Byung-Hyuk Min, both of Seoul, Rep. of Korea

[73] Assignee: Samsung Electronics Co., Ltd., Suwon, Rep. of Korea

[21] Appl. No.: 08/266,420

[22] Filed: Jun. 27, 1994

[30] Foreign Application Priority Data

Jun. 25, 1993 [KR] Rep. of Korea ............... 93-11738

[51] Int. Cl.$^6$ ..................................... H01L 29/76
[52] U.S. Cl. ............... 257/407; 257/66; 257/364; 257/412
[58] Field of Search ................. 257/66, 75, 270, 257/364–367, 412, 407, 28

[56] References Cited

U.S. PATENT DOCUMENTS

| | | | |
|---|---|---|---|
| 4,745,079 | 5/1988 | Pfiester | 437/29 |
| 4,811,066 | 3/1989 | Pfiester et al. | 257/407 |
| 5,064,775 | 11/1991 | Chang | 437/29 |
| 5,124,769 | 6/1992 | Tanaka et al. | 257/366 |
| 5,381,032 | 1/1995 | Kokawa et al. | 257/412 |
| 5,418,392 | 5/1995 | Tanabe | 257/412 |

FOREIGN PATENT DOCUMENTS

| | | | |
|---|---|---|---|
| 59-134879 | 8/1984 | Japan | 257/412 |
| 62-94984 | 5/1987 | Japan | 257/407 |
| 1-232765 | 9/1989 | Japan | 257/407 |
| 6-61482 | 3/1994 | Japan | 257/412 |

*Primary Examiner*—Sara W. Crane
*Attorney, Agent, or Firm*—Cushman Darby & Cushman Intellectual Property Group of Pillsbury Madison & Sutro LLP

[57] ABSTRACT

A method for fabricating a MOS transistor having an offset resistance in a channel region controlled by a gate voltage and structure thereof is disclosed. A gate electrode is divided into three adjacent regions of respectively a second conductivity type, first conductivity type and second conductivity type connected laterally to one another on a channel region. A gate control voltage is applied to a central region of the first conductivity type, and a predetermined voltage between maximum and minimum values of the gate control voltage is applied to left and right adjacent regions of the second conductivity type. If a gate turn-on voltage is applied to the central region the gate turn-on voltage is forward biased to the adjacent left and right regions and is therefore also applied to the forwardly biased left and right regions. The effective length of the gate electrode then becomes the total length of the central region and the left and right adjacent regions. If a gate turn-off voltage is applied to the central region the central region becomes reverse biased with the left and right adjacent regions and thus the effective length of the gate electrode becomes the length of only the central region of the first conductivity type. This reduces the length of the channel region, and thus forms an offset resistance structure which reduces leakage current in the off state of the MOS transistor.

18 Claims, 4 Drawing Sheets

5,894,157

MOS TRANSISTOR HAVING AN OFFSET RESISTANCE DERIVED FROM A MULTIPLE REGION GATE ELECTRODE

BACKGROUND OF THE INVENTION

1. Field of the Invention

The present invention relates to a method for fabricating a transistor and a structure thereof, and more particularly to a method for fabricating a gate electrode of a metal oxide semiconductor (MOS) transistor and a structure thereof.

2. Background of Related Art

A conventional transistor fabricated on a semiconductor substrate, in particular a conventional transistor with a thin gate insulation layer, has a disadvantage in that leakage current which flows between the source and drain regions increases while a turn-off voltage is applied to a gate electrode. This problem is caused by an electric field which forms in the channel region toward the gate electrode from the drain (or source) region to which a voltage higher than a voltage supplied to the gate electrode is applied. Such a problem is more serious in a transistor formed such that a channel region is adjacent to the source and drain regions formed by self-aligning the gate electrode with the source and drain regions.

FIG. 1A shows a conventional thin film MOS transistor. In the transistor, source and drain regions 10$b$, 10$c$ are self-aligned with a gate electrode 14. FIG. 1B shows another conventional thin film MOS transistor having an offset resistance structure with an offset resistance being formed by the distance between the source and drain regions and an enlarged channel region.

Referring to FIG. 1A, a gate insulation layer 12 and a gate electrode 14 are formed on an active layer 10 made of polycrystalline silicon or amorphous silicon. A region positioned under the gate insulation layer 12 operates as a channel region 10$a$. The regions adjacent to of the channel region 10$a$ are the source and drain regions 10$b$, 10$c$, which are subjected to an ion-implantation so as to operate as a source region 10$b$ and a drain region 10$c$, respectively. The source and drain regions 10$b$ and 10$c$ are subjected to the ion-implantation by using the gate electrode 14 as a mask, and therefore, the locations of the source and drain regions are self-aligned with the gate electrode 14. Prior art which discloses such a conventional self-aligned structure is disclosed in U.S. Pat. No. 4,597,160, which issued in 1986.

However, in the conventional transistor which has a self-aligned source and drain region 10$b$, 10$c$, the channel region 10$a$ is positioned directly under the gate electrode and is therefore adjacent to the source and drain regions 10$b$, 10$c$. This allows the formation of an electric field between the channel region and the drain (or source) region 10$b$, 10$c$ when receiving a predetermined voltage and between the channel region and the gate electrode when receiving a turn-off voltage which is lower than the predetermined voltage applied to the drain or source region 10$b$, 10$c$. This electric field transmits an exicited energy to the carriers which are trapped within a depletion region formed between the source or drain region and the channel region. As a result, the excited carriers deviate from the depletion region and produce a leakage current. Consequently, when the turn-off voltage is applied to the gate electrode, a leakage current, which always flows between the source and drain regions 10$b$, 10$c$, increases.

To solve such a problem of the conventional MOS transistor, an offset resistance structure has been proposed which separates the channel region from the source and drain regions by a predetermined distance.

Referring to FIG. 1B, a conventional thin film MOS transistor having an offset resistance structure is shown. The MOS transistor has a gate insulation layer 18 and a gate electrode 20 formed on an active layer 16. The left and right regions of the active layer 16 as depicted in FIG. 1B are doped to form a source region 16$b$ and a drain region 16$c$, while region positioned under the gate insulation layer 18 functions as a channel region 16$a$. The total length of the undoped regions 16$d$, 16$a$, 16$e$ of the active layer 16 between the source and drain regions 16$b$ and 16$c$ is longer than that under the gate electrode 20. The resistances of the undoped regions 16$d$, 16$e$ positioned respectively between the channel region 16$a$ and the source and drain regions 16$b$ and 16$c$ function as an offset resistance to reduce leakage current. Since the gate electrode 20 is separated from the source and drain regions 16$b$, 16$c$, the influence of an electric field which forms between the gate electrode 20 and the source (or drain) regions 16$b$, 16$c$ is reduced. As a result, the leakage current between the gate electrode 20 and the source or drain regions 16$b$, 16$c$ decreases.

However, in order to fabricate the conventional MOS transistor having the conventional offset resistance structure as shown in FIG. 1B, an additional photo lithographic process is needed. Hence, the offset resistance structure is disadvantageous because the process by which it is formed is complicated as compared with the conventional self-aligning process, and the cost of manufacturing thereof rises. Further, since the channel region 16$a$ is separated from the source and drain regions, the turn-on current through the channel 16$a$ is reduced when a turn-on voltage is applied to the gate electrode 20. Thus, the conventional offset resistance structure suffers from a further disadvantage in that the gate driving force is lowered.

SUMMARY OF THE INVENTION

It is an object of the present invention to provide a method for fabricating a MOS transistor and a structure thereof which has reduced the leakage current between a gate electrode and source and drain regions when a turn-off voltage is applied to the gate electrode.

It is another object of the present invention to provide a method for fabricating a MOS transistor and a structure thereof which has reduced the leakage current between a gate electrode and source and drain regions when a turn-off voltage is applied to the gate electrode, and which renders a sufficient gate driving force when a turn-on voltage is applied to the gate electrode.

It is a further object of the present invention to provide a method for fabricating a MOS transistor and a structure thereof which has a variable length channel region which varies in response to a voltage applied to a gate electrode.

According to an aspect of the present invention, a MOS transistor comprises gate electrode divided into three regions of respectively a second conductivity type, a first conductivity type and the second conductivity type. These three regions are connected laterally to one another over a channel region. A gate control voltage is applied to the central of the three regions, and a predetermined voltage between maximum and minimum values of a gate control voltage is applied to the left first and third regions. The predetermined voltage can be any voltage between the maximum and minimum values of the gate control voltage, for instance halfway between the maximum and minimum value. When a turn-on voltage is applied to the gate electrode, the three regions of the gate electrode are forwardly biased from the central region to the outer regions. When a turn-off voltage is applied to the gate electrode, the three regions become reversely biased from the central region to the outer region. Consequently, if a gate turn-on voltage is applied to the central region the gate turn-on voltage is also applied to the forwardly biased outer regions and the effective length of the gate electrode becomes the total length of all three regions. However, when a gate turn-off voltage is applied to the central region since the central region becomes reversely biased with the outer regions, the effective length of the gate electrode becomes the length of only the central region.

BRIEF DESCRIPTION OF THE DRAWINGS

The advantages and features of the present invention will be more apparent from the following detailed description with reference to the attached drawings, wherein.

DETAILED DESCRIPTION OF THE PREFERRED EMBODIMENT

Figure 1A:
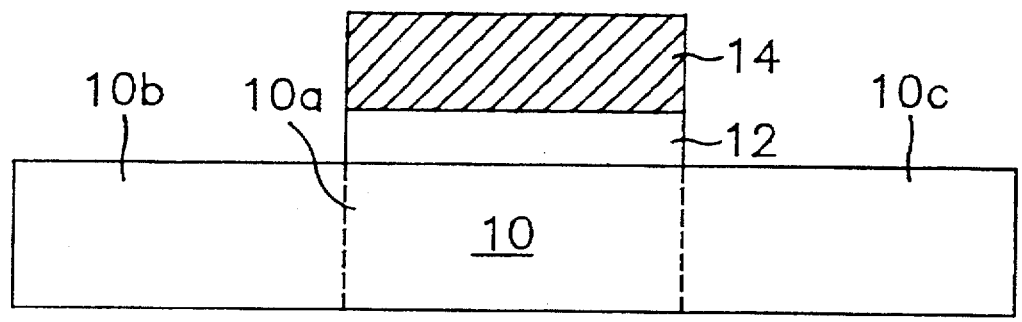
FIG. 1A is a sectional view of a conventional thin film MOS transistor.
Figure 1B:
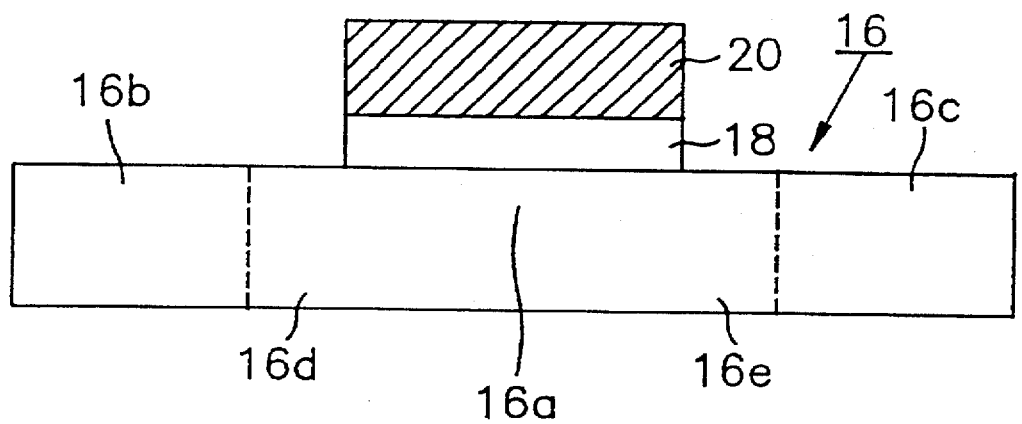
FIG. 1B is a sectional view of another conventional thin film MOS transistor having an offset resistance structure.
Figure 2A:
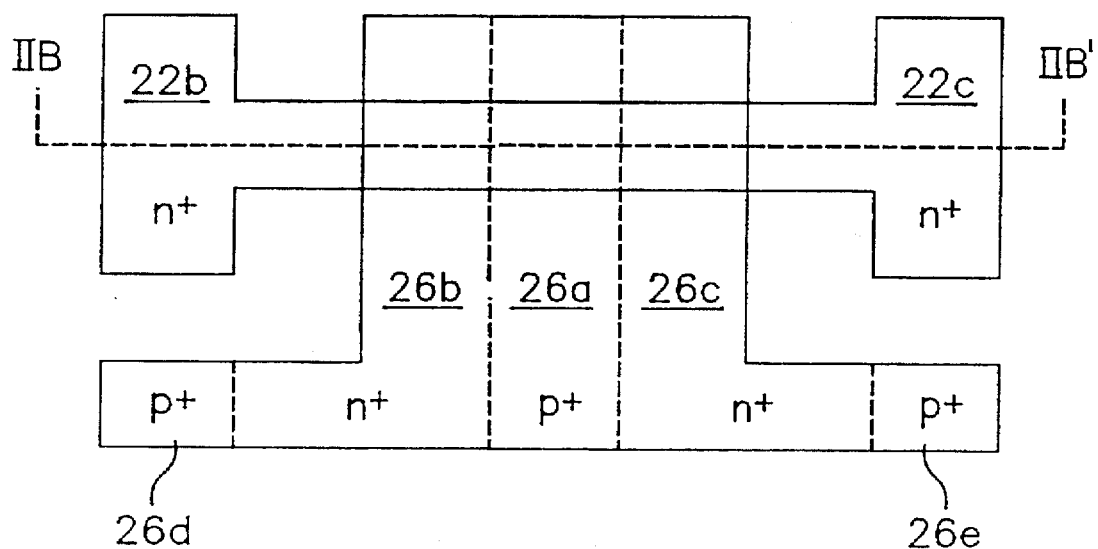
FIG. 2A is a plan view of a thin film MOS transistor according to an embodiment of the present invention.
Figure 2B:
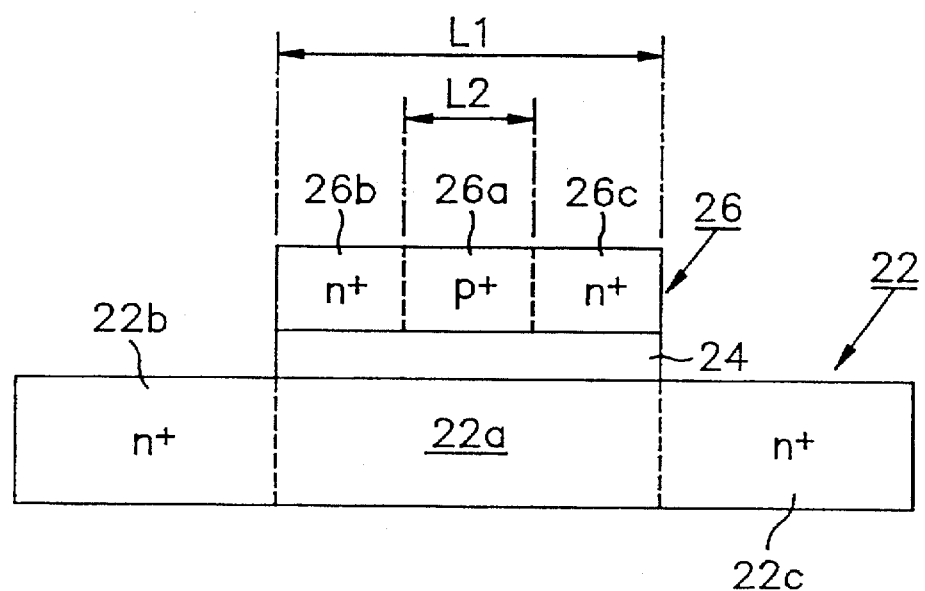
FIG. 2B is a sectional view taken along line IIB—IIB' of FIG. 2A.

Referring to FIGS. 2A and 2B, a gate insulation layer 24 and a gate electrode 26 are formed on an active layer 22 made of amorphous silicon or polycrystalline silicon. The gate electrode 26 has a plane structure of a reverse "T"-shape and is partitioned into 5 neighboring regions 26a–26e. A central region 26a of the gate electrode 26 is doped with a p-type impurity and adjacent left and right regions 26b and 26c thereof are doped with an n-type impurity. Left and right edge regions 26d and 26e of the gate electrode 26 are doped with the p-type impurity. The gate electrode 26 is insulated from the active region 22 by a gate insulation layer 24. A gate control voltage Vg is applied to the central region 26a of the gate electrode 26, and a voltage between maximum and minimum values of the gate control voltage Vg, i.e., ½ Vg, is applied to the left and right edge regions 26d and 26e. When a turn-on voltage Vg is applied, the effective length of the gate electrode 26 interacting with the active layer 22 is the summed length of the individual lengths of the central region 26a and the adjacent left and right regions 26b and 26c, which is L1. When a turn-off voltage Vg is applied to the central region 26a of the gate electrode 26, the effective length of the gate electrode 26 is the length of only the central region 26a, which is L2. The active layer positioned under the gate electrode 26 and the gate insulation layer 24 operates as a channel region 22a. The left and right active regions adjacent to the channel region 22a are doped to function as a source region 22b and a drain region 22c.

In operation, if the gate control voltage Vg applied to the central region 26a of the gate electrode 26 is a turn-on voltage, forward biases are formed between the central region 26a and the adjacent left and right regions 26b and 26c, respectively. Therefore, the turn-on voltage applied to the central region 26a is conducted to the adjacent left and right regions 26b and 26c. At the same time, reverse biases are formed between the left and right edge regions 26d and 26e to which ½ Vg is applied and the left and right regions 26b and 26c, respectively. As a result, the central region 26a and the adjacent left and right regions 26b and 26c function as a conductor of a single body, and the effective length of the gate electrode 26 becomes L1. Thus, the entire length of the undoped active region 22a functions as the channel region.

If the gate control voltage applied to the central region 26a of the gate electrode 26 is a turn-off voltage, a ground voltage for example, forward biases are formed between the edge regions 26d and 26e and the left and right adjacent regions 26b and 26c, respectively. The voltage of the edge regions 26d and 26e is transmitted to the left and right adjacent regions 26b and 26c. Then, reverse biases are formed between the left and right adjacent regions 26b and 26c and the central region 26a, respectively. Therefore, the effective length of the gate electrode 26 becomes L2 which is the length of the central region 26a. Thus, an offset resistance structure of a thin film MOS transistor in which the gate electrode is effectively separated from the source and drain regions is formed. A resistance component of the undoped region positioned under the left and right adjacent regions 26b and 26c of the gate electrode 26 function as an offset resistance.

Therefore, in the gate electrode of a MOS transistor according to the present invention, the effective length of the gate electrode (and therefore the length of the channel region) varies with the level of the gate control voltage applied to the gate electrode. As the effective length of the gate electrode varies, the length of the channel positioned thereunder also varies. Hence, an offset resistance is formed when the gate voltage is applied at a turn-off level, which thus minimizes the leakage current. Meanwhile, when the gate voltage is applied at a turn-on level, the channel region becomes adjacent to the source and drain regions, thus ensuring a sufficient gate driving force.

Figure 3A:
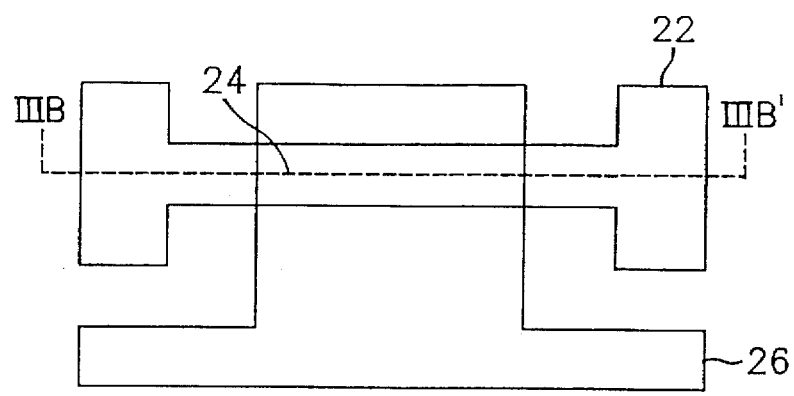
FIGS. 3A to 3F are plane and sectional views showing a process of forming a thin film MOS transistor shown in FIGS. 2A and 2B.
Figure 3B:
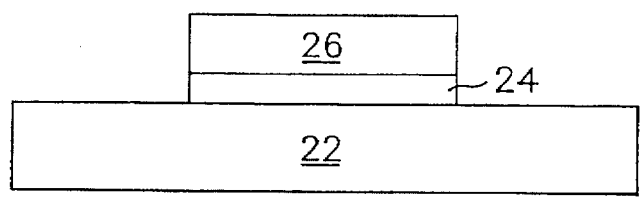
Figure 3C:
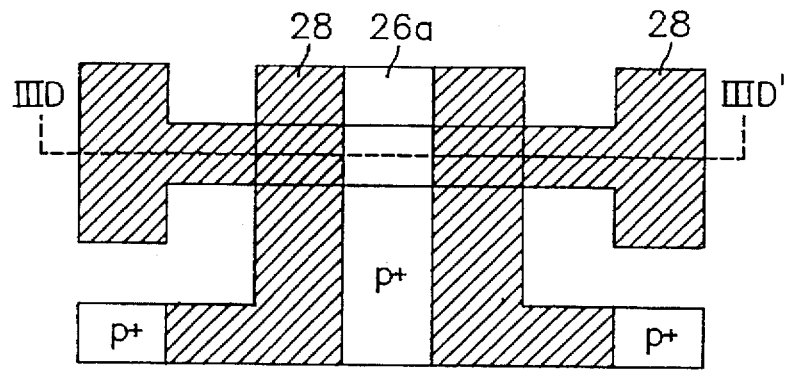
Figure 3D:
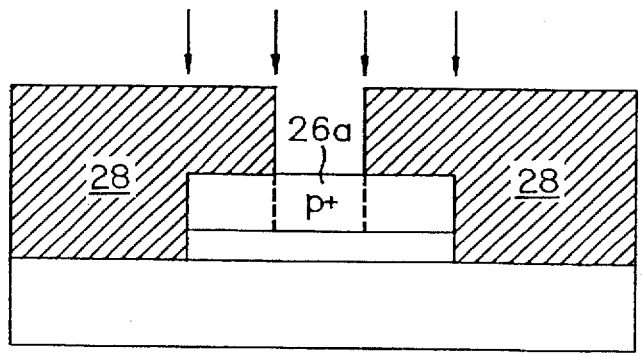
Figure 3E:
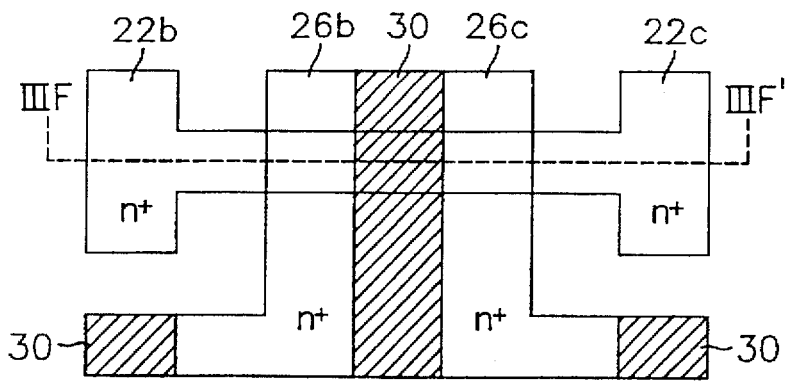
Figure 3F:
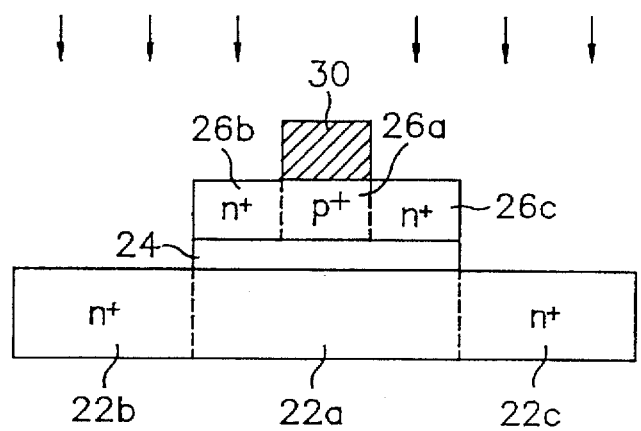

FIGS. 3A, 3C and 3E are plan views showing a process for forming the thin film MOS transistor of the embodiment shown in FIGS. 2A and 2B, while FIGS. 3B, 3D and 3F are sectional views taken along lines IIIB–IIIB', IIID–IIID', and IIIF–IIIF' of FIGS. 3A, 3C and 3E, respectively.

Referring to FIGS. 3A and 3B, amorphous silicon or polycrystalline silicon is deposited on a transparent substrate such as glass and patterned by a typical photo lithographic process to form an active region 22. Thereafter, an insulation layer and a gate electrode layer are successively formed on the whole surface of the active layer 22 and patterned to respectively form a gate insulation layer 24 and a gate electrode 26. The portion of the gate electrode 26 which overlaps the active region 22 operates as a gate of the thin film MOS transistor.

Referring to FIGS. 3C and 3D, a first photoresist mask 28 is applied to expose an ion-implant area and a p-type impurity is implanted into the central region 26a and the edge regions 26d and 26e of the gate electrode 26. The first photoresist mask is thereafter removed.

Referring to FIGS. 3E and 3F, a second photoresist mask 30 is applied to expose another ion-implant area and an n-type impurity is implanted into the left and right adjacent regions 26b and 26c of the gate electrode 26 and the source and drain regions 22b and 22c. Therefore, the gate electrode 26 positioned on the channel region 22a has an NPN junction structure. After the ion-implantation, the photo resist mask 30 is removed.

In this preferred embodiment, a voltage between maximum and minimum values of the gate control voltage, ½ Vg for example, is applied to the left and right edge regions 26d and 26e of the gate electrode 26. However, other modifications may be practiced. For example, the left edge region 26d of the source region side may be connected to the source region 22b, and the right edge region 26e of the drain region side may be connected to the drain region 22c. Moreover, the edge regions 26d and 26e may be commonly connected to either the source region 22b or the drain region 22c.

Figure 4:
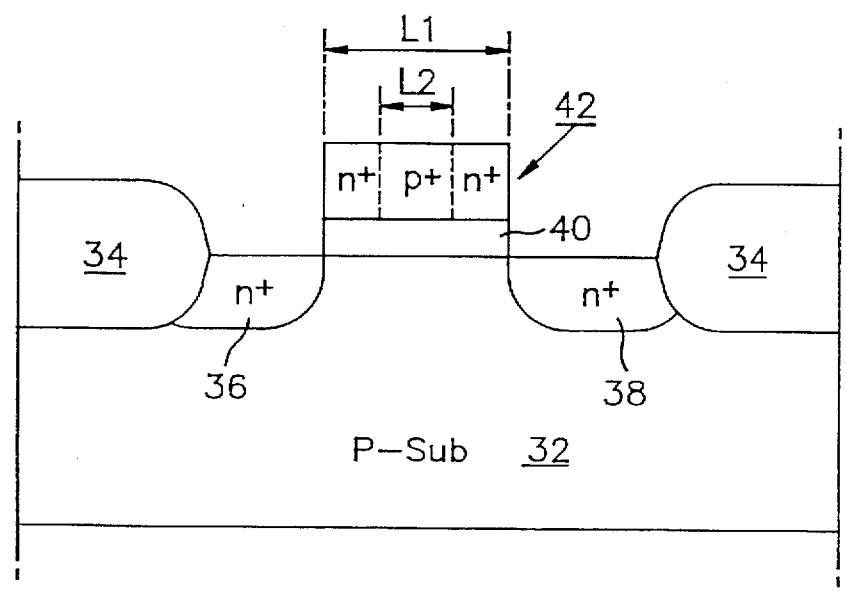
FIG. 4 is a sectional view of a MOS transistor fabricated on a semiconductor substrate according to another embodiment of the present invention.

Referring to FIG. 4, a MOS transistor formed on a single crystalline silicon substrate is shown. Isolation layers 34 are formed on a p-type single crystalline silicon substrate 32 and n$^+$ source and drain regions 36 and 38 are formed there between. A gate insulation layer 40 and a gate electrode 42 are formed on a channel region positioned between the source and drain regions 36 and 38. The gate electrode 42 has an NPN junction structure and is divided into three regions which have the length L1. The length of the central p-type region of the gate electrode 42 is L2. The gate control voltage Vg is applied to the central p-type region of the gate electrode 42, and a voltage between maximum and minimum values of the gate control voltage, ½ Vg for example, is applied to the left and right n-type regions. As described in FIGS. 2A and 2B, when the gate control voltage applied to the gate electrode is at a turn-on voltage level, the effective length of the gate electrode becomes L1. Alternatively, when the gate control voltage is at a turn-off voltage level, the effective length of the gate electrode becomes L2. Therefore, the influence of the electric field between the gate electrode and a higher biased source or drain region is reduced. Consequently, a breakdown voltage of a depletion region formed between the channel region and the source and drain regions is increased.

As described above, in the inventive gate electrode structure of the present invention, the effective length of the gate electrode varies with the turn-on or turn-off voltage of the channel. Therefore, when the voltage applied to the gate electrode is a turn-off voltage, leakage current is suppressed by the formed offset resistance and the breakdown voltage of the depletion region between the channel region and the source and drain regions is increased. When the voltage applied to the gate electrode is a turn-on voltage, the gate electrode structure having a sufficient gate driving force is provided. These advantages are particularly favorable to a thin film MOS transistor or a MOS device having a short channel.

In the preferred embodiment of the present invention, the structures described herein are applied for an NMOS transistor. However, it will be understood by those skilled in the art that foregoing and other changes in form and details may be made without departing from the spirit and scope of the invention and that it may be possible, for example, to apply the structures to a PMOS transistor. Further, the principles of the present invention are also applicable to a power transistor which operates at high electric field.

While the invention has been particularly shown and described with reference to a preferred embodiment and alterations thereto, it should be understood by those skilled in the art that various changes in form and detail may be made therein without departing from the spirit and scope of the invention.

What is claimed is:

1. A metal oxide semiconductor transistor, comprising:
   a channel region;
   a gate insulation layer formed on said channel region;
   a gate electrode formed on said gate insulation layer;
   a source region formed adjacent a first side of said channel region and being self-aligned with said channel region;
   a drain region formed adjacent a second side of said channel region opposite said first side and being self-aligned with said channel region;
   said gate electrode comprising;
      a central conductor region of a first conductivity type formed in a center of said gate electrode,
      a first adjacent conductor region of a second conductivity type formed adjacent a first side of said central conductor region,
      a second adjacent conductor region of said second conductivity type formed adjacent a second side of said central conductor region opposite said first side, said first and second adjacent conductor regions of said gate electrode forming first and second junctions with said central conductor region, respectively, and
      biasing means for forward biasing said first and second junctions when a turn-on voltage is applied to said central conductor region, and for reverse biasing said first and second junctions when a turn-off voltage is applied to said central conductor region.

2. A metal oxide semiconductor transistor according to claim 1, wherein said channel region is formed of polycrystalline silicon.

3. A metal oxide semiconductor transistor according to claim 1, wherein said channel region is formed of amorphous silicon.

4. A metal oxide semiconductor transistor according to claim 1, wherein said channel region is formed of single crystalline silicon.

5. A metal oxide semiconductor transistor according to claim 1 wherein said first conductivity type is opposite said second conductivity type.

6. A metal oxide semiconductor transistor according to claim 5 wherein said first conductivity type is a P-type semiconductor material and said second conductivity type is an N-type semiconductor material.

7. A metal oxide semiconductor according to claim 1 wherein said central conductor region, said first adjacent conductor region and said second adjacent conductor region are coplanar.

8. A metal oxide semiconductor transistor, comprising:
   a channel region;
   a gate insulation layer formed on said channel region;
   a gate electrode formed on said gate insulation layer, said gate electrode comprising:
      a central semiconductor region of a first conductivity type formed in a center of said gate electrode,
      a first adjacent semiconductor region of a second conductivity type formed adjacent a first side of said central semiconductor region,
      a second adjacent semiconductor region of said second conductivity type formed adjacent a second side of said central semiconductor region opposite said first side, said first and second adjacent semiconductor regions of said gate electrode forming first and second junctions with said central semiconductor region, respectively,
      a third adjacent semiconductor region of said first conductivity type formed adjacent a first side of said first adjacent semiconductor region opposite said first junction, and a fourth adjacent semiconductor region of said first conductivity type formed adjacent a first side of said second semiconductor region opposite said second junction, said third and fourth adjacent semiconductor regions of said gate electrode forming third and fourth junctions with said first and second adjacent semiconductor regions of said gate electrode, respectively;

a source region formed adjacent a first side channel region and being self-aligned with said channel region; and a drain region formed adjacent a second side of said channel region opposite said first side and being self-aligned with said channel region.

9. A metal oxide semiconductor transistor according to claim 8, wherein said third and fourth adjacent conductor regions are connected to a predetermined voltage source which provides a voltage which is less than a maximum voltage to be applied to said central conductor region of said gate electrode.

10. A metal oxide semiconductor transistor according to claim 8, wherein said third adjacent, said first adjacent, said central, said second adjacent, and said fourth adjacent semiconductor regions of said gate electrode form respectively a PNPNP junction over said channel region.

11. A metal oxide semiconductor transistor according to claim 8, wherein said third adjacent, said first adjacent, said central, said second adjacent, and said fourth adjacent semiconductor regions of said gate electrode form respectively an NPNPN junction over said channel region.

12. A metal oxide semiconductor transistor according to claim 8, wherein said metal oxide semiconductor transistor is a thin film MOS transistor.

13. A metal oxide semiconductor transistor according to claim 8, wherein said first conductivity type is a P-type semiconductor material and said second conductivity type is an N-type semiconductor material.

14. A metal oxide semiconductor according to claim 1, wherein said gate electrode further comprises:

a third adjacent semiconductor region of said first conductivity type formed adjacent a first side of said first adjacent semiconductor region opposite said first junction, and a fourth adjacent semiconductor region of said first conductivity type formed adjacent a first side of said second semiconductor region opposite said second junction, said third and fourth adjacent semiconductor regions of said gate electrode forming third and fourth junctions with said first and second adjacent semiconductor regions of said gate electrode, respectively.

15. A metal oxide semiconductor according to claim 14, wherein said biasing means includes means for applying a predetermined voltage to said third and fourth adjacent semiconductor regions of said gate electrode.

16. A metal oxide semiconductor according to claim 15, wherein said predetermined voltage has a level between said turn-off voltage and said turn-on voltage.

17. A metal oxide semiconductor according to claim 14, wherein said biasing means includes means for connecting said third adjacent semiconductor region to one of said source and drain regions and means for connecting said fourth adjacent semiconductor region to the other of said source and drain regions.

18. A metal oxide semiconductor according to claim 14, wherein said biasing means includes means for commonly connecting said third and fourth adjacent semiconductor regions to one of said source and drain regions.

\* \* \* \* \*